(12) United States Patent
Rimondi et al.

(10) Patent No.: US 8,537,602 B2
(45) Date of Patent: Sep. 17, 2013

(54) 5T SRAM MEMORY FOR LOW VOLTAGE APPLICATIONS

(75) Inventors: Danilo Rimondi, Mozzo (IT); Carolina Selva, Cologno Monzese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 168 days.

(21) Appl. No.: 13/173,272

(22) Filed: Jun. 30, 2011

(65) Prior Publication Data

US 2012/0002459 A1  Jan. 5, 2012

(30) Foreign Application Priority Data

Jun. 30, 2010  (IT) .............................. MI2010A1196

(51) Int. Cl.
*G11C 11/00*  (2006.01)
(52) U.S. Cl.
USPC .............................. 365/154; 365/63; 365/156
(58) Field of Classification Search
USPC ..................... 365/154, 156, 51, 63; 257/368, 257/388
See application file for complete search history.

(56) References Cited

U.S. PATENT DOCUMENTS

| | | | |
|---|---|---|---|
| 6,998,722 B2 * | 2/2006 | Madurawe | ........................ 257/66 |
| 7,092,279 B1 | 8/2006 | Sheppard | |
| 7,176,125 B2 * | 2/2007 | Liaw | ............................. 438/637 |
| 2004/0214389 A1 * | 10/2004 | Madurawe | .................... 438/202 |
| 2005/0207212 A1 | 9/2005 | Tsujimura et al. | |
| 2007/0076467 A1 | 4/2007 | Yamaoka et al. | |
| 2007/0139997 A1 | 6/2007 | Suzuki et al. | |

OTHER PUBLICATIONS

Search Report for Italian Patent Application No. MI20101194, Ministero dello Sviluppo Economico, Munich, Jan. 10, 2011, pp. 3.

* cited by examiner

*Primary Examiner* — Gene Auduong
(74) *Attorney, Agent, or Firm* — Graybeal Jackson LLP

(57) ABSTRACT

An embodiment of a memory device of SRAM type integrated in a chip of semiconductor material is proposed. The memory device includes a plurality of memory cells each for storing a binary data having a first logic value represented by a first reference voltage or a second logic value represented by a second reference voltage. Each memory cell includes a bistable latch—having a main terminal, a complementary terminal, a set of field effect main storage transistors coupled to the main terminal for maintaining the main terminal at the reference voltage corresponding to the stored logic value or to a complement thereof, a set of field effect complementary storage transistors coupled to the complementary terminal for maintaining the complementary terminal at the reference voltage corresponding to the complement of the logic value associated with the main terminal—and a field effect access transistor for accessing the main terminal. The chip includes an isolated well, the access transistor and at least one of the complementary storage transistors being formed in the isolated well.

48 Claims, 8 Drawing Sheets

5T SRAM MEMORY FOR LOW VOLTAGE APPLICATIONS

PRIORITY CLAIM

The instant application claims priority to Italian Patent Application No. MI2010A001196, filed Jun. 30, 2010, which application is incorporated herein by reference in its entirety.

RELATED APPLICATION DATA

This application is related to U.S. patent application Ser. No. 13/173,333, entitled DYNAMICALLY CONFIGURABLE SRAM CELL FOR LOW VOLTAGE OPERATION filed Jun. 30, 2011; which application is incorporated herein by reference in its entirety.

TECHNICAL FIELD

One or more embodiments relate to the field of memories. More specifically, an embodiment relates to a Static Random Access Memory or SRAM.

BACKGROUND

For some time the market of electronic products is increasingly focused on mobile devices (computers, mobile phones and personal digital assistants, for example). Batteries that have a limited availability of energy provide power needed to operate these mobile devices. Thus the need of reducing the power consumption of all the electronic components (central processing unit, memory, display, etc.) included in mobile devices arose, in order to extend the autonomy of such mobile devices with the same batteries used.

Typically, the electronic components are Systems On A Chip or SOCs, i.e., complete electronic systems integrated on a single chip of semiconductor material. In this case, the desired reduction in power consumption is achieved through a reduction in operating voltages of transistors included in the SOCs. In particular, the SRAMs included in such SOCs comprise a number of transistors which is equal to 50%-90% of the total number of transistors present on the same SOC. Considering that the power consumption of electronic components affects the total power consumption of the SOC in proportion to their number of transistors, it is clear that the reduction of the operating voltage of the SRAM memories results in a substantial reduction in the power consumption of the entire SOC.

As it is known, a random access memory or RAM is a special type of memory wherein each memory cell (capable of storing a binary data, or bits) can be directly accessed with the same access time. In particular, a SRAM memory does not require any refresh operation of the stored data, as it retains data values for a theoretically infinite time (at least up to a shutdown of an electronic system wherein the SRAM memory is used).

The reference memory cell in the SRAM memories (for example, commonly used in CMOS-type technology) is formed by six transistors, and therefore it is usually called "6T" memory cell. In particular, a 6T memory cell includes a bistable latch formed by two crossed logic inverters (i.e., with an input of each inverter coupled to an output of the other inverter), each of which includes two transistors. The bistable latch has two stable equilibrium conditions corresponding to the two possible logic values (i.e., 0 or 1) of the stored bit. Two access transistors are used to selectively access the bistable latch during a read or write operation of the corresponding memory cell.

A five-transistor memory cell called "5T" was derived from the 6T memory cell by removing one of the access transistors to the bistabile latch. The removal of such access transistor (and, therefore, also of the components for driving it) allows for a savings in area up to 20-30% compared to the 6T memory cell, while its power consumption is substantially halved.

Unfortunately, the reduction of the operating voltages of the transistors may generate serious problems related to the reliability of the memory cell. Indeed, at a low operating voltage it is much more difficult, if not impossible, to force the switching of the transistors for writing the memory cell (as the operating voltage may be not sufficient to overcome a threshold voltage of the transistors required for their switching).

However, the required circuits specifications for a reliable writing (i.e., able to properly write the wanted bit in the memory cell) are opposed to the circuits specifications needed to achieve a stable reading (i.e., a reading that does not change the bit stored in the read memory cell) and to obtain a stable standby condition (i.e., where no changes occur in the bit stored upon time). In more detail, for achieving a correct writing, the access transistors should be very conductive to force the bistable latch to change its equilibrium condition, while for ensuring a stable reading and a stable standby condition, the access transistors should have a reduced conductivity to avoid an undesired switching of the bistable latch (though this conductivity may not be kept too low so as to allow transferring the read bit). Therefore, known expedients concerning ratios between the transistor sizes or form factors of the transistors themselves may not be successfully applied; for example, optimizing the form factors of the transistors to obtain a reliable writing may result in a memory cell with low stability in reading and in standby condition and, conversely, optimizing the form factors to have a stable memory cell in reading and in the stand-by condition may result in a low reliability in writing.

In particular, the asymmetry of the 5T memory cells makes even higher the contrast between the specifications required for a stable reading and standby condition and the specifications required for a reliable writing. In order to obtain a reliable writing, it may be necessary that the access transistor of the memory cell should be very conductive while the transistors that form the logic inverters should have different conductivity from each other to compensate for the asymmetry of the memory cell. Such conductivity values are different to those required for good stability in reading and standby condition. In addition, the memory cell is more unstable when storing a determined logic value (e.g., the logic value 0) compared to when storing the other logic value. In fact, during a reading of the memory cell (which implies that the bistable latch is biased to a non-zero reading voltage through the access transistor), such reading voltage is input to the inverter to which the access transistor is coupled; therefore, in a condition of the inverter (corresponding to the logic value 0) the reading voltage tends to switch it, while in the other condition of the inverter (corresponding to the logic value 1) the reading voltage tends to maintain the same condition. A similar problem may occur in a standby condition of the memory cell, due to capacitive coupling between the inverter and the access transistor.

The problem of the stability in reading and in the standby condition may be exacerbated by the increasing size reduction (scaling) of the transistors. In this case, the transistors are much more sensitive to changes in voltage at their terminals, and this may lead to unwanted currents even for small voltage fluctuations (tenths of volt). In addition, transistors with much reduced dimensions are subject to greater fluctuations in the values of their physical parameters (due to the increased weight of aberrations in an optical lithographic technique commonly used for their formation). Therefore, transistors formed at different times and/or in different regions of the same chip may present mismatches in their physical parameters, undermining the correct and stable operation of the devices.

SUMMARY

In general terms, an embodiment is based on an idea of integrating the access transistor on the opposite side of the bistable latch.

More specifically, an embodiment is a memory device of SRAM type integrated in a chip of semiconductor material. The memory device includes a plurality of memory cells each for storing a binary data having a first logic value (represented by a first reference voltage) or a second logic value (represented by a second reference voltage). Each memory cell includes a bistable latch having a main terminal, a complementary terminal, a set of field-effect main storage transistors (coupled to the main terminal for maintaining the main terminal at the reference voltage corresponding to the stored logic value or to a complement thereof), a set of field-effect complementary storage transistors (coupled to the complementary terminal for maintaining the complementary terminal at the reference voltage corresponding to the complement of the logic value associated with the main terminal); the memory cell further includes a field-effect access transistor for accessing the main terminal. In an embodiment, the chip includes an isolated well, the access transistor, and at least one of the complementary storage transistors being formed in the isolated well.

Another embodiment is a corresponding method.

BRIEF DESCRIPTION OF THE DRAWINGS

One or more embodiments, as well as features and advantages thereof, may be better understood with reference to the following detailed description, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION

Figure 1:
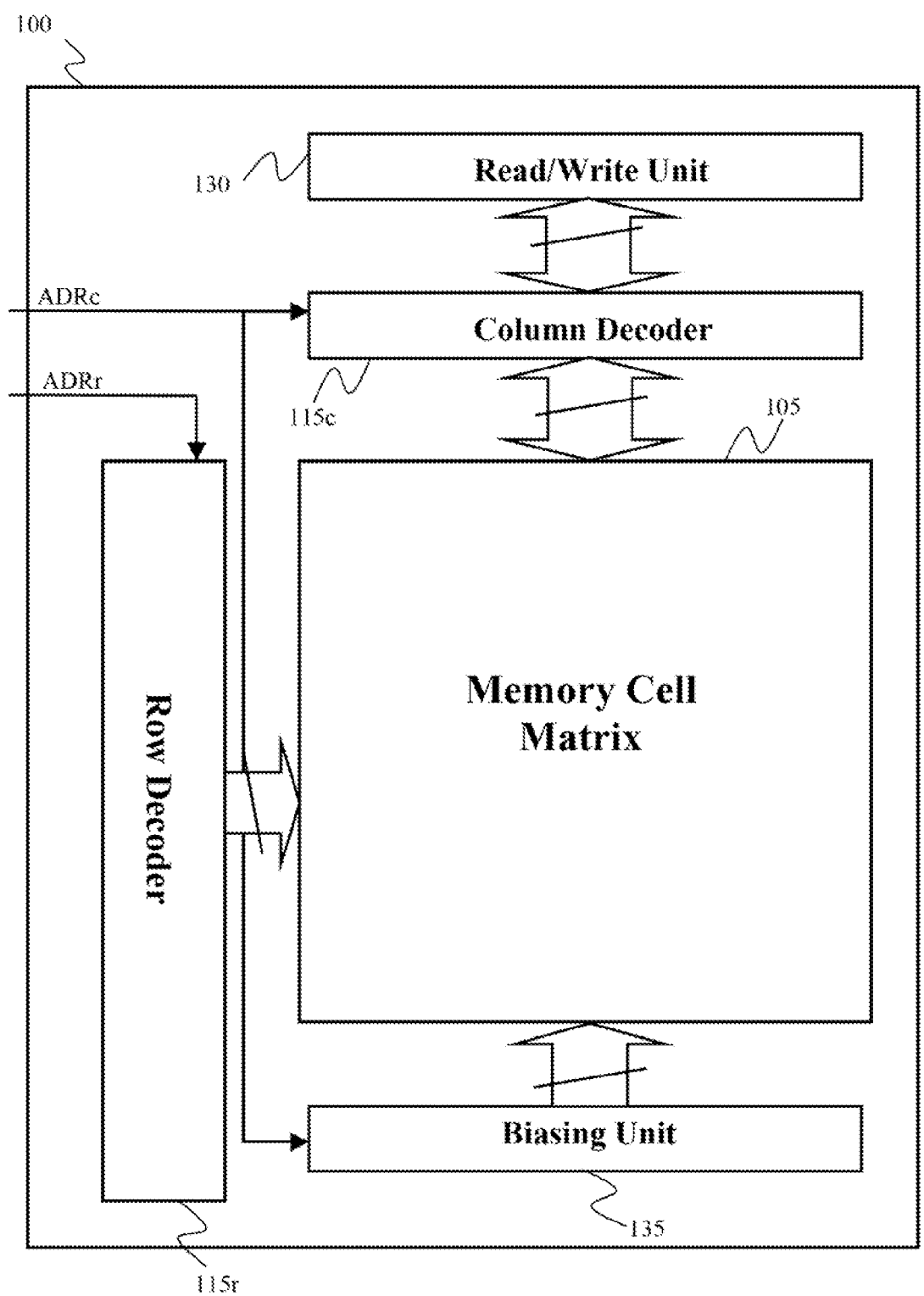
FIG. 1 illustrates a principle block diagram of a memory device in which an embodiment is applicable.

With particular reference to FIG. 1, there is shown a principle block diagram of a memory device 100, wherein an embodiment is applicable; more specifically, the memory device 100 is of an SRAM type. The memory device 100 includes a matrix 105 of memory cells (not shown in the figure), which is organized into rows and columns. Each memory cell is adapted to store a bit; normally, the memory device 100 simultaneously processes (in writing and reading) words of a certain number of bits (e.g., 8), by accessing a same number of memory cells simultaneously.

The memory device 100 also includes a row decoder 115$r$ and a column decoder 115$c$. Access to memory cells of a selected word (in reading and writing) is made by decoding a row address ADRr and a column address ADRc, which are supplied to the row decoder 115$r$ and to the column decoder 115$c$, respectively. In response thereto, the row decoder 115$r$ selectively provides different bias voltages to the memory cells of each row; in addition, the column decoder 115$c$ selectively couples the memory cells of each column to a read/write unit 130, which contains all the circuitry used to read and write the selected memory cells (e.g., driving circuits, comparators, etc.). Additionally, the column address ADRc is supplied to a biasing unit 135, which selectively provides various further bias voltages to the memory cells of each column.

Figure 2:
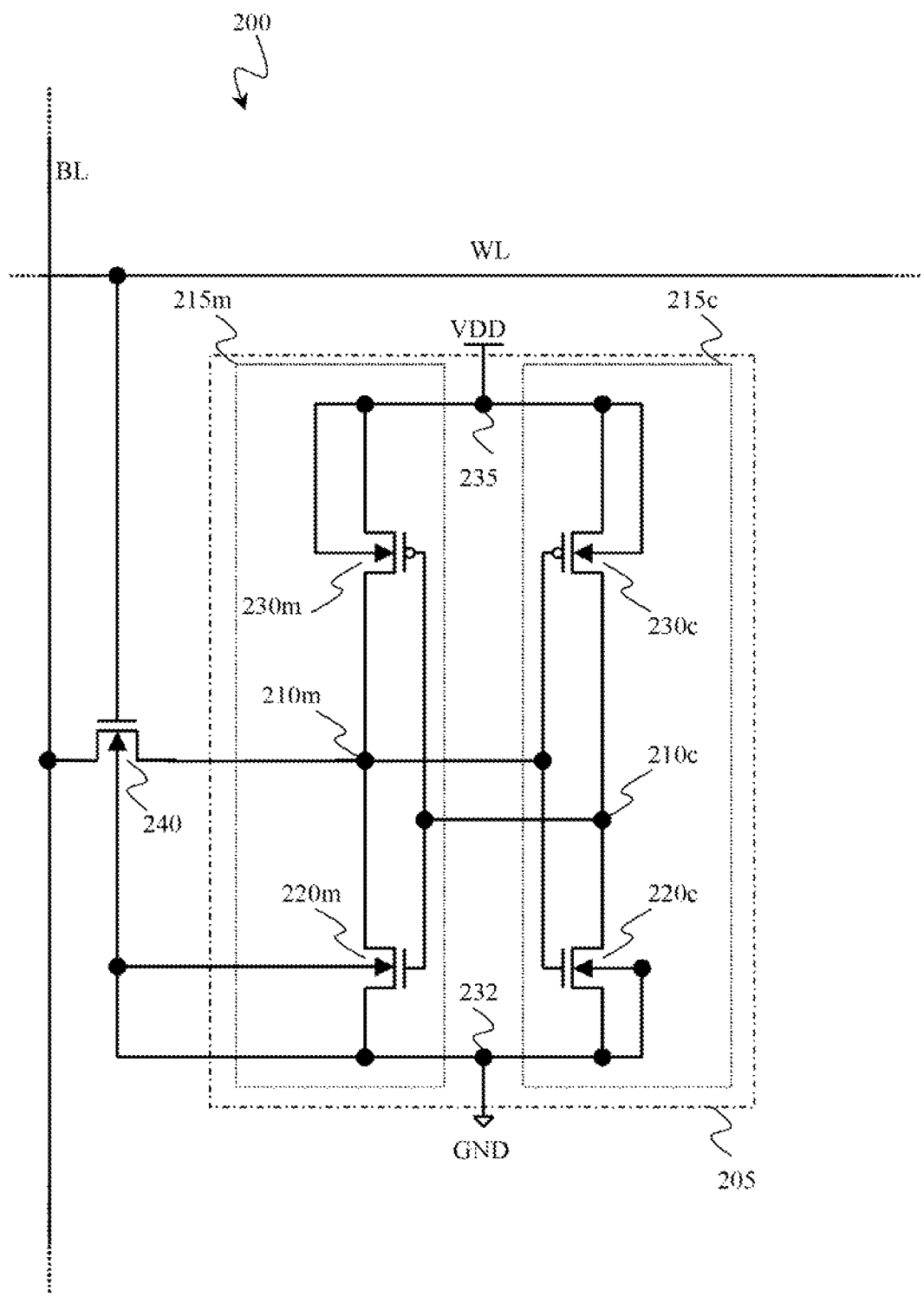
FIG. 2 illustrates a principle circuit diagram of a conventional memory cell.

Turning now to FIG. 2, there is shown a principle circuit diagram of a memory cell 200 known in the art included in the memory device described above; in particular, the memory cell 200 is of the 5T type (as formed by five transistors). From a functional point of view, the memory cell 200 includes a bistable latch 205, which comprises a main terminal 210$m$ and a complementary (or secondary) terminal 210$c$. The bistable latch 205 is formed by two NOT gates (logic inverters) indicated as main NOT gate 215$m$ and complementary NOT gate 215$c$. Each NOT gate 215$m$, 215$c$ includes an N-channel MOS storage transistor 220$m$, 220$c$ (pull-down transistor) and a P-channel MOS storage transistor 230$m$, 230$c$ (pull-up transistor). The pull-down transistor 220$m$, 220$c$ has a source terminal coupled to a reference terminal 232 that provides a reference (or ground) voltage GND of the memory device 100, and the pull-up transistor 230$m$, 230$c$ has a source terminal coupled to a power supply terminal 235 that provides a supply voltage VDD of the memory device 100 (e.g., 1-2 V). The pull-down transistor 220$m$, 220$c$ and the pull-up transistor 230$m$, 230$c$ have a common gate terminal defining an input terminal of the NOT gate 215$m$, 215$c$, which is coupled to the other terminal 210$c$, 210$m$ of the bistable latch 205; in addition, the pull-down transistor 220$m$, 220$c$ and the pull-up transistor 230$m$, 230$c$ have a common drain terminal defining an output terminal of the NOT gate 215$m$, 215$c$, which is coupled to the corresponding terminal 210$m$, 210$c$ of the bistable latch 205. With this arrangement, the logic NOT gates 215$m$ and 215$c$ are then coupled in positive feedback. The memory cell 200 also includes an N-channel MOS access transistor 240$m$ (pass-gate transistor). The pass-gate transistor 240 has a conduction terminal (source/drain) coupled to the main terminal 210$m$ of the bistable latch 205. All the (N-channel) transistors 220$m$, 220$c$, 240 have a bulk terminal coupled to the reference terminal 232; on the contrary, all the (P-channel) pull-up transistors 230m, 230c have a bulk terminal coupled to the power supply terminal 235.

A bit line BL is coupled to another conduction terminal of the pass-gate transistor 240. Such bit line BL couples all the memory cells of the same column of the matrix to the column decoder (not shown in the figure). A word line WL is coupled to a gate terminal of the pass-gate transistor 240. The word line WL couples all the memory cells of the same row of the matrix to the row decoder (not shown in the figure).

The bistable latch 205 has two stable equilibrium conditions. In particular, when the main terminal 210m is at a voltage corresponding to a first logic value, such as a logic value 0 (typically, corresponding to the ground voltage GND) and the complementary terminal 210c is at a voltage corresponding to a second logic value, such as a logic value 1 (typically corresponding to the supply voltage VDD), the bistable latch 205 stores the logic value 0; conversely, when the main terminal 210m is at the voltage corresponding to the logic value 1 and the complementary terminal 210c is at the voltage corresponding to the logic value 0, the bistable latch 205 stores the logic value 1.

During a write operation of a selected bit in the memory cell 200, the bit line BL is pre-loaded to the voltage of the bit to be written; the word line WL is then enabled (e.g., to the supply voltage VDD), so that the pass-gate transistor 240 is turned on thereby coupling the main terminal 210m with the main bit line BL; in this way, the memory cell 200 moves to the equilibrium condition corresponding to the bit to be written; by disabling the word line WL (for example, to the ground voltage GND), the pass-gate transistor 240 is switched off, so that the written bit is stored into the memory cell 200 until a new write operation thereon (or up to the shutting down of the memory device).

During a read operation of the memory cell 200, the bit line BL is pre-loaded to a predetermined pre-load voltage (e.g., the supply voltage VDD). The word line WL is then enabled so that the pass-gate transistor 240 is switched on thereby coupling the main terminal 210m with the bit line BL. In this way, depending on whether the memory cell 200 stores the logic value 0 or the logic value 1, the bit line BL will start discharging or will maintain the pre-load voltage value. The read/write circuit (not shown in the figure) detects a final voltage value of the bit line BL; such final voltage value being high or low allows determining the logic value (0 or 1, respectively) of the bit stored in the memory cell 200.

Figure 3:
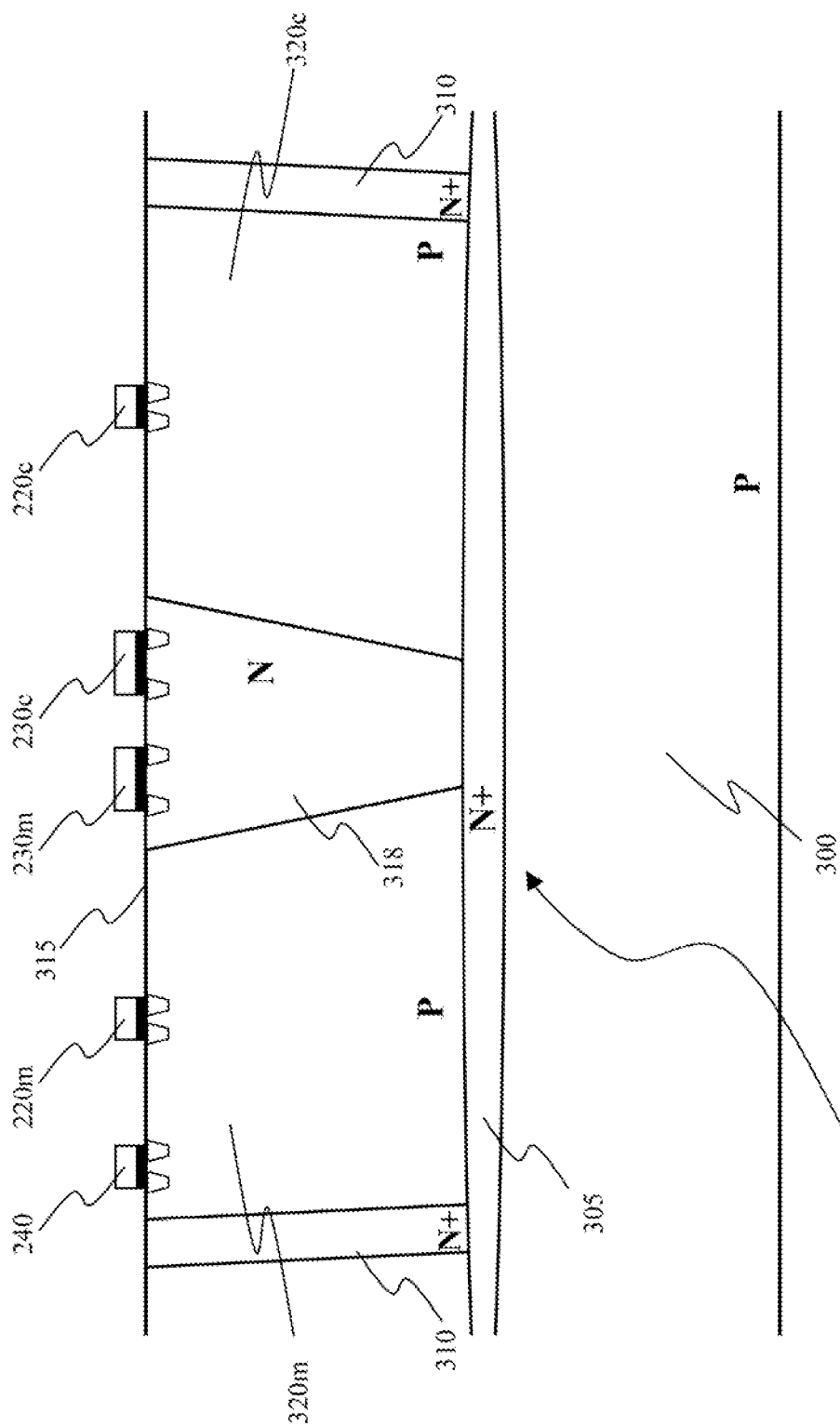
FIG. 3 schematically illustrates a cross-sectional detail of a chip of semiconductor material wherein a matrix of memory cells according to a conventional structure is formed.

In FIG. 3 there is schematically shown a cross-sectional detail of a chip of semiconductor material 300 (e.g., silicon) in which the matrix of memory cells according to a conventional structure is formed. For example, the chip 300 is of P-type (as usual, the concentrations of impurities (or dopant) of N-type and P-type are denoted by adding the sign + or the sign − to the letters N and P to indicate a high or low concentration of impurities, respectively; the letters N and P without the addition of any sign + or − denote intermediate concentration values). For the sake of simplicity, in the figure there is shown a portion of the chip 300 which comprises a single memory cell 200. In detail, by the use of a technique called Deep N-Well or DNW, a buried region 305 of N+ type is implanted deeply into the chip 300. At this point, there is formed (for example, by ion implantation, or by a deposition preceded by an etching phase) a contact region 310 of N+ type, which extends from a front surface 315 of the chip 300 to contact the buried region 305 so as to delimitate a portion of the chip 300 for the memory cell 200. Within the contact region 310 there is formed an N-type well 318, which extends from the front surface 315 to contact the buried region 305; the N-type well 318 divides the portion of the chip delimited by the buried region 305 and the contact region 310 into a P-type main well 320m and a P-type complementary well 320c (electrically isolated from the rest of the chip 300 when the corresponding PN junctions are reverse biased). Inside the main P-type well 320m there are formed the main pull-down transistor 220m and the pass-gate transistor 240 of the memory cell 200, while inside the complementary P-type well 320c there is formed the complementary pull-down transistor 220c (each one consisting of an N+ type drain region, an N+ type source region and an overbridging gate region). Inside the N-type well 318 there are formed the main pull-up transistor 230m and the complementary pull-up transistor 230c of the memory cell 200 (each one consisting of a P+ drain region, a P+ source region and an overbridging gate region).

Figure 4:
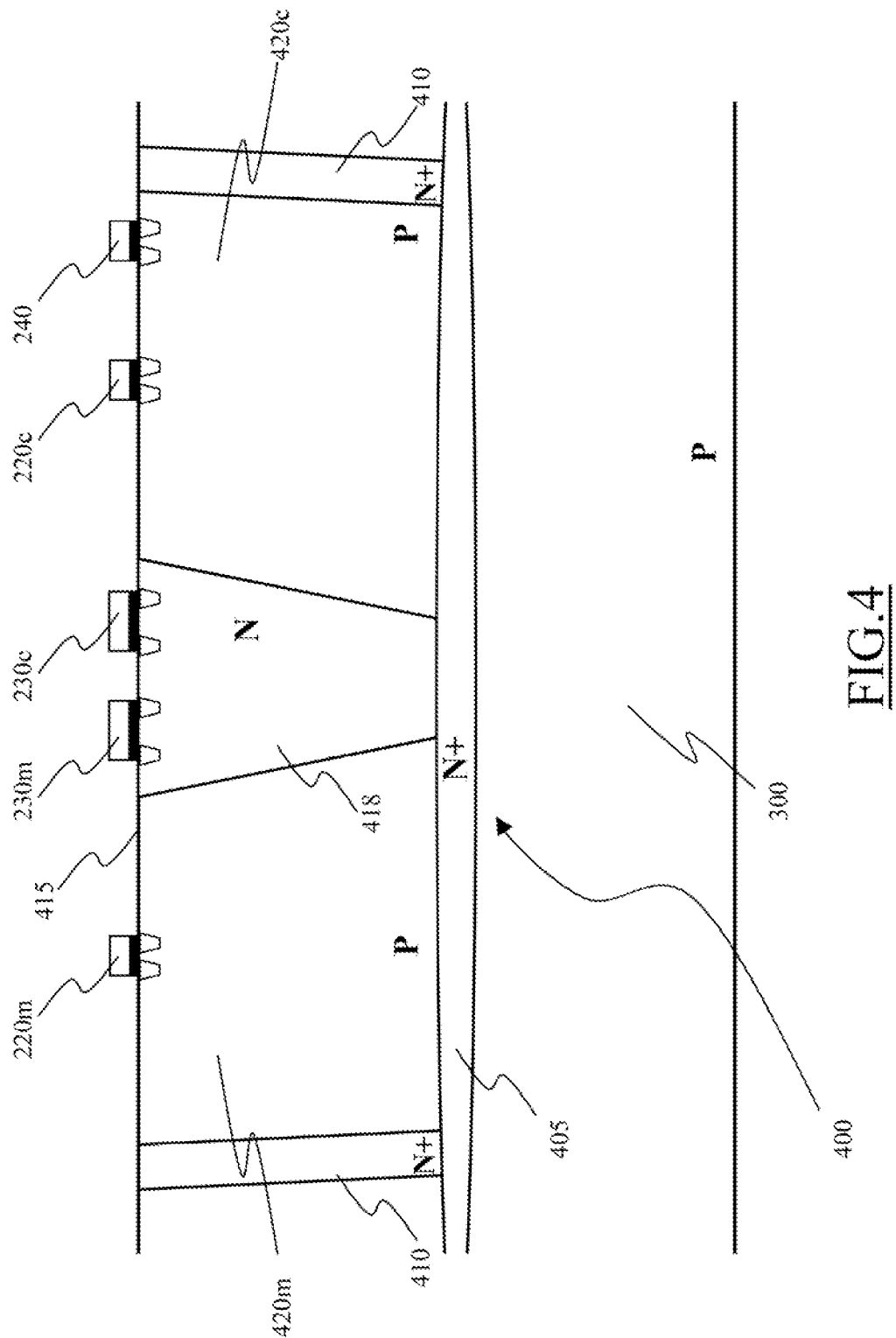
FIG. 4 schematically illustrates a cross-sectional detail of a chip of semiconductor material wherein a matrix of memory cells according to an embodiment is formed.

In FIG. 4 a cross-sectional detail of the same chip 300 of semiconductor material is shown wherein the matrix of memory cells according to an embodiment is formed. For the sake of simplicity, in the figure a portion of the chip 300 which comprises a single memory cell 400 is illustrated. In general, the strategy followed in an embodiment consists in starting from transistors sized to make the memory cell more reliable in writing (to ensure that correct switching occurs), and to recover the stability in reading and in the standby condition with the techniques described below.

Through the same techniques hereinabove described, there are formed an N+ type buried region 405, and an N-type contact region 410, which extends from a front surface 415 of the chip 300 to contact the buried region 405 in such a way to delimit a portion of the chip 300 for the memory cell 400. Within the contact region 410 there is formed an N-type well 418, which extends from the front surface 415 to contact the buried region 405; the N-type well 418 divides the portion of the chip delimited by the buried region 405 and the contact region 410 into a P-type main well 420m and a P-type complementary well 420c. Inside the main P-type well 420m, now there is only formed the main pull-down transistor 220m, while inside the P-type complementary well 320c there are formed the complementary pull-down transistor 220c and also the pass-gate transistor 240 (each one formed by an N+ type drain region, an N+ type source region and an overbridging gate region). Also in this case, inside the N-type 418 well there are formed the main pull-up transistor 230m and the complementary pull-up transistor 230c of the memory cell 400 (each one formed by a P+ drain region, a P+ source region and an overbridging gate region).

With this arrangement, the pass-gate transistor 240 and the main pull-down transistor 220m are formed in two P-type wells 420m and 420c mutually independent from each other. Therefore, in an embodiment, it may be possible to act independently on the pass-gate transistor 240 and on the main pull-down transistor 220m (as will be described in greater detail below); this allows obtaining various advantages in terms of writing reliability and/or of stability in reading and in the standby condition of the memory cell 400.

Figure 5:
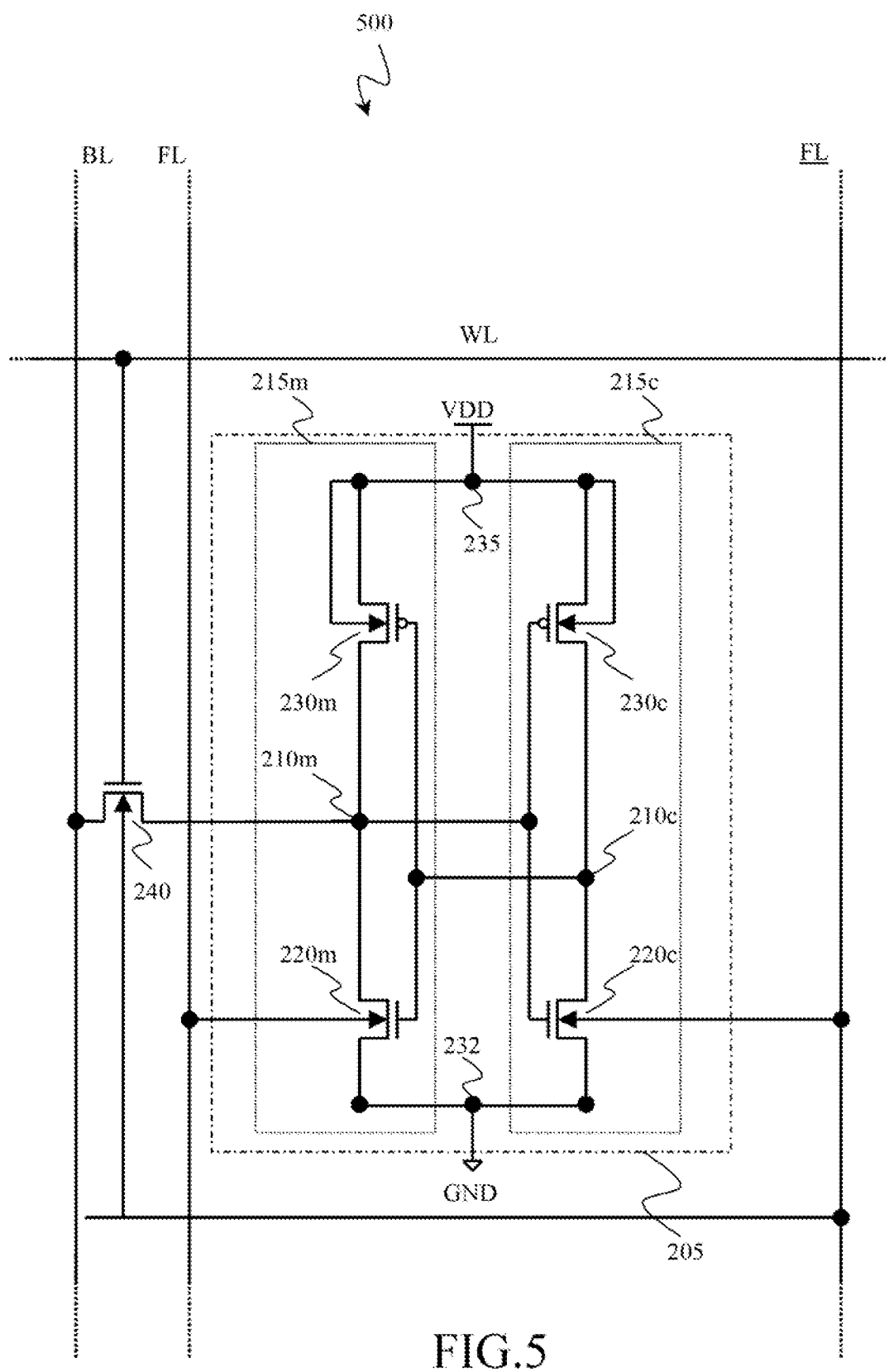
FIG. 5 illustrates a principle circuit diagram of a memory cell according to an embodiment.

In particular, FIG. 5 illustrates a principle circuit diagram of a memory cell 500 according to an embodiment. The memory cell 500 differs from the memory cell described above as follows. The memory cell 500 includes a main well line FL coupled to the bulk terminal of the main pull-down transistor 220m (i.e., the common P-type well in which it is formed), and a complementary well line $\overline{FL}$ coupled to the bulk terminal of the complementary pull-down transistor 220c and to the bulk terminal of the pass-gate transistor 240 (i.e., the common complementary P-type well in which they are formed). The well lines FL and $\overline{FL}$ couple all the memory cells in the same column of the matrix to the biasing unit (not shown in the figure).

The operation of the memory cell 500 may be summarized as follows.

First of all, let us consider the case wherein the memory cell 500 stores the logic value 0 (i.e., with the main terminal 210m at the ground voltage GND and the complementary terminal 210c at the supply voltage VDD). In this condition, the main pull-down transistor 220m is turned on, while the main pull-up transistor 230m is turned off; on the contrary, the complementary pull-down transistor 220c is turned off, while the complementary pull-up transistor 230c is turned on.

If the logic value 1 is to be written, the bit line BL is brought to the supply voltage VDD (and the word line WL is brought to the power supply voltage VDD). In this way, the pass-gate transistor 240 turns on, thereby causing the turning on of the complementary pull-down transistor 220c and the turning off of the complementary pull-up transistor 230c. In this way, the complementary terminal 210c is brought to the ground voltage GND, so that the main pull-down transistor 220m turns off and the main pull-up transistor 230m turns on.

In an embodiment, the complementary well line $\overline{FL}$ provides a writing bias voltage $VFB_1$ greater than zero (e.g., 0.2-0.4V); the main well line FL instead provides the ground voltage GND. The writing bias voltage $VFB_1$ acts on the transistors 240 and 220c through an effect known as the body effect. Such body effect causes a reduction of a threshold voltage VTN of the transistors 220c, 240 with a quadratic proportionality with respect to the value of the writing bias voltage $VFB_1$. Thus, there is a writing threshold voltage $VTN_{F1}$ of the transistors 220c, 240 to which the writing bias voltage $VFB_1$ is applied, which is lower than a normal threshold voltage $VTN_0$ of the main pull-down transistor 220m to which the ground voltage GND is applied (e.g., 0.05-0.15V instead of 0.2V). Therefore, the pass-gate transistor 240 turns on more easily, even when the supply voltage VDD applied to its gate terminal is of low value; in addition, the pass-gate transistor 240 is more conductive, thereby facilitating the charging of the main terminal 210m to the supply voltage VDD. In addition, also the complementary pull-down transistor 220c turns on more easily, even when the supply voltage VDD applied to its gate terminal is of low value; moreover, the complementary pull-down transistor 220c is more conductive, thereby facilitating the discharging of the complementary terminal 210c to the ground voltage GND.

Considering now instead the case wherein the memory cell 500 stores the logic value 1 (i.e., with the main terminal 210m at the supply voltage VDD and the complementary terminal 210c at the ground voltage GND). In such condition, the main pull-down transistor 220m is turned off, while the main pull-up transistor 230m is turned on; on the contrary, the complementary pull-down transistor 220c is turned on, while complementary pull-up transistor 230c is turned off.

If the logic value 0 has to be written, the bit line BL is brought to the ground voltage GND (while the word line WL is brought to the power supply voltage VDD). In this way, the pass-gate transistor 240 turns on, thereby causing the turning off of the complementary pull-down transistor 220c and the turning on of the complementary pull-up transistor 230c. In this way, the complementary terminal 210c is brought to the supply voltage VDD, so that the main pull-down transistor 220m turns on and the main pull-up transistor 230m turns off.

In an embodiment, the complementary well line $\overline{FL}$ provides another writing bias voltage $VFB_0$ greater than zero but lower than the writing bias voltage $VFB_1$ (e.g., 0.1-0.3V<0.2-0.4V); the main well line FL provides the ground voltage GND. In this way, there is a writing threshold voltage $VTN_{F0}$ of the transistor 220c, 240 to which the writing bias voltage $VFB_0$ is applied, which is still below the normal threshold voltage $VTN_0$ of the main pull-down transistor 220m to which the ground voltage GND is applied, but to a lesser extent compared to the previous case—i.e., it is comprised between the normal threshold voltage $VTN_0$ and the writing threshold voltage $VTN_{F1}$ (e.g., 0.08-0.16V between 0.05-0.15V and 0.2V). This again allows an easier turning on of the pass-gate transistor 240, even when the supply voltage VDD applied to its gate terminal is of low value, without excessively slowing down the turning off of the complementary pull-down transistor 220c; it is noted that the effect of such biasing on the pass-gate transistor 240 is predominant with respect to that on the complementary pull-down transistor 220c, so its net result facilitates the writing of the memory cell 500.

During a read operation of a bit stored in the memory cell 500, the main well line FL provides a reading bias voltage VRB greater than zero but lower than the writing bias voltages $VFB_1$ and $VFB_0$ (e.g., 0.09-0.19V<0.1-0.3V); the complementary well line $\overline{FL}$ instead provides the ground voltage GND. In this way, there is a reading threshold voltage $VTN_R$ of the transistor 220m to which the reading bias voltage VRB is applied, which is lower than the normal threshold voltage $VTN_0$ of the transistors 220c, 240 to which the ground voltage GND is applied, but greater than the writing threshold voltages $VTN_{F0}$ and $VTN_{F1}$ (e.g., 0.9-0.18V between 0.08-0.16V and 0.2V).

Thanks to the above mentioned reading threshold voltage $VTN_R$ the main pull-down transistor 220m is more conductive. Consequently, during the read operation, such main pull-down transistor 220m is able to reduce (due to its higher conductivity) an increasing in the voltage of the main terminal 210m caused by the supply voltage VDD to which the bit line BL (coupled to the main terminal 210m by the access transistor 240) is pre-loaded. If the memory cell 500 stores the logic value 0 (i.e., with the main pull-down transistor 220m on, the main pull-up transistor 230m off, the complementary pull-down transistor 220c off, and the complementary pull-up transistor 230c on), this prevents the turning on of the complementary pull-down transistor 220c (controlled by the main terminal 210m) and the turning off of the main pull-down transistor 220m (due to its reduced reading threshold voltage $VTN_R$), thereby causing a spurious switching of the bistable latch 205. In case the memory cell 500 stores the logic value 1 (i.e., with the main pull-down transistor 220m off, the main pull-up transistor 230m on, the complementary pull-down transistor 220c on, and the complementary pull-up transistor 230c off) such increase in the voltage of the main terminal 210m instead tends to maintain the same equilibrium condition of the bistable latch 205, so that the reduction of its reading threshold voltage VTNR caused by the above mentioned biasing of the main pull-down transistor 220m does not affect the preservation of such equilibrium condition.

During a standby condition of the memory cell 500 (i.e., when no write or read operation of such memory cell 500 is undertaken) the same biasing pattern provided in the case of the read operation is applied, that is the main well line FL provides the reading bias voltage VRB, while the complementary well line $\overline{FL}$ provides the ground voltage GND, thereby obtaining the same reading threshold voltage $VTN_R$ for the main pull-down transistor 220m.

As above, this ensures a safe storage of the logic value 0 in the memory cell 500 against fluctuations in voltage values that may affect the memory cell 500 (fluctuations in the values of the supply voltage VDD, electromagnetic interference, etc.), which may increase the voltage at the main terminal 210*m* (without compromising the storage of the logic value 1).

An embodiment allows selectively increasing the reliability of the write operation in the memory cell or the stability of the same memory cell 500 during the read operation or in the standby condition. In particular, an embodiment is particularly effective when the pass-gate transistor 240 is formed so as to be more conductive than the main pull-down transistor 220*m* (i.e., with the pass-gate transistor 240 having a relationship between the width and the length of its active area, known as form factor, greater than the form factor of the main pull-down transistor 220*m*). The more conductive the pass-gate transistor 240 is, the more reliable the write operation. This optimization of the memory cell 500 in writing, however, affects the stability in reading and in the standby condition thereof; in fact, the pass-gate transistor 240 being more conductive than the main pull-down transistor 220*m* may facilitate a spurious switching in the memory cell 500 (during the read operation or in the standby condition) when it stores the logic value 0 (since it facilitates the increase of the voltage at the main terminal 210*m* that tends to turn on the complementary pull-down transistor 220*c*, and facilitates the turning off of the main pull-down transistor 220*m*). However, this risk is actually avoided by the proposed biasing during the read operation and in the standby condition, so that it may be possible to achieve a more reliable writing without compromising the stability of the reading and in the standby condition.

In an alternative embodiment, the complementary pull-down transistor 220*c* and the pass-gate transistor 240 of the memory cell 500 are formed with different process parameters with respect to the corresponding process parameters of the main pull-down transistor 220*m*—an operation made possible by the fact that the complementary pull-down transistor 220*c* and the pass-gate transistor 240 are formed in a different P-type well from that in which the main pull-down transistor 220*m* is formed. For example, the P-type well in which the complementary pull-down transistor 220*c* and the pass-gate transistor 240 are formed has a doping greater than the doping of the main P-type well in which the main pull-down transistor 220*m* is formed. In this way, the complementary pull-down transistor and the pass-gate transistor have a threshold voltage greater than the main pull-down transistor 220*m* has (e.g., 0.3-0.4V instead of 0.2V), i.e., the formers are less conductive than the latter.

An embodiment may allow increasing the stability of the memory cell 500 during the read operation or in the standby condition, without the need to apply a well bias voltage and hence reducing the power consumption of the memory cell 500.

This optimization of the memory cell 500 in reading and in the standby condition, however, affects the reliability of the writing thereof; in fact, the pass-gate transistor 240 is less conductive than the main pull-down transistor 220*m*, thereby making more difficult the write operation of the logic value 1 when the memory cell stores the logic value 0 (since the lower threshold voltage of the main pull-down transistor 220*m* thwarts the increasing of the voltage of the main terminal 210*m*). However, such problem may be solved thanks to the proposed biasing during the write operation, which is actually able to make the same more reliable without compromising the stability of the read operation and of the standby condition.

Figure 6:
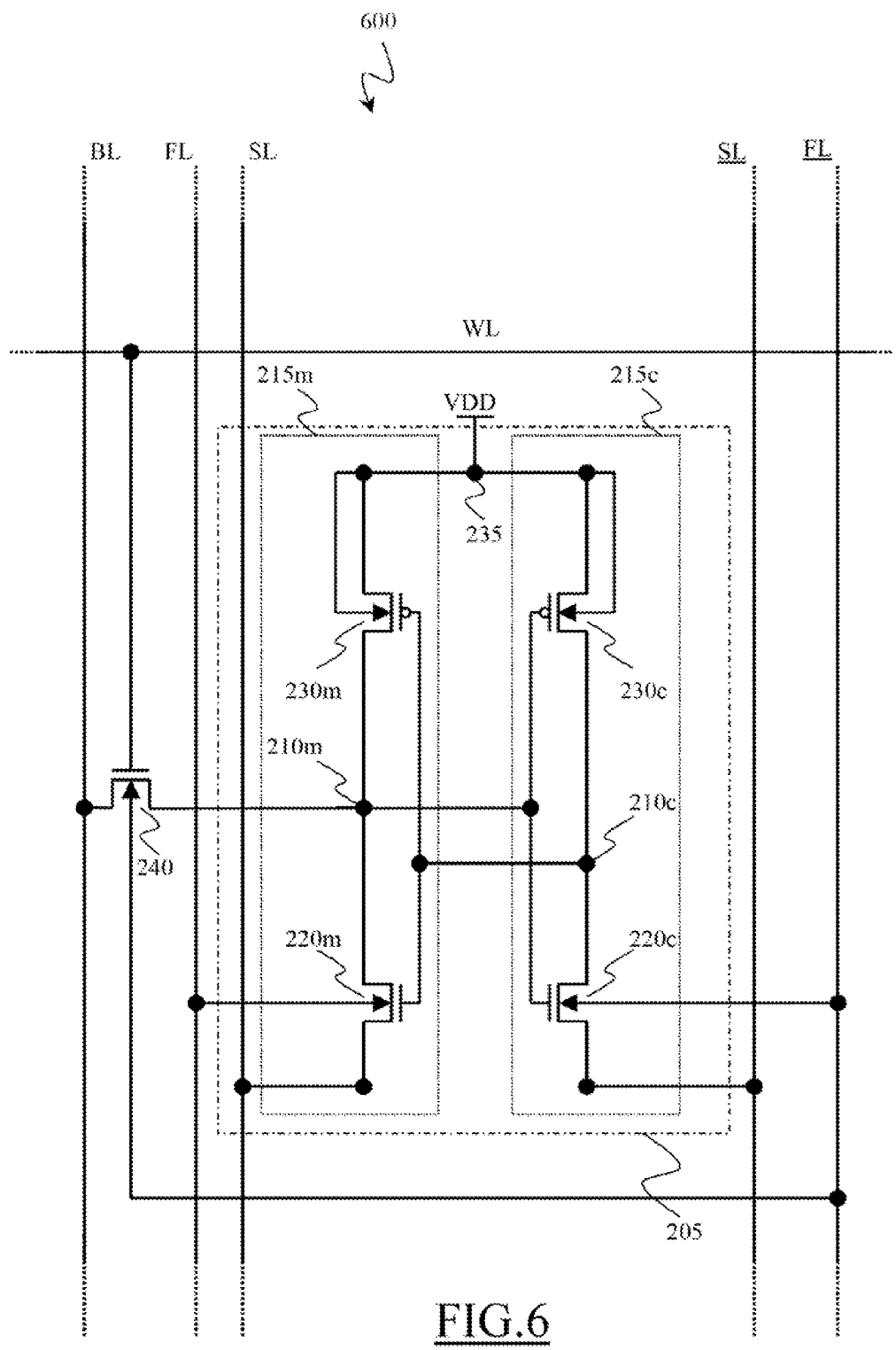
FIG. 6 illustrates a principle circuit diagram of a memory cell according to a further embodiment.

FIG. 6 illustrates a principle circuit diagram of a memory cell 600 according to a further embodiment. The memory cell 600 differs from the memory cell described above as follows.

The memory cell 600 includes a main source line SL coupled to the source terminal of the main pull-down transistor 220*m*, and a complementary source line $\overline{SL}$ coupled to the source terminal of the complementary pull-down transistor 220*c*. The source lines SL and $\overline{SL}$ couple all the memory cells of the same column of the array to the column decoder.

The operation of the memory cell 600 may be summarized as follows. During a write operation of a logical value 1, 0 the source line SL, $\overline{SL}$ provides a bias voltage VS greater than zero (e.g., 0.2-0.4V), while the other source line $\overline{SL}$, SL provides the ground voltage GND. The bias voltage VS reduces a corresponding control voltage VGS of the pull-down transistor 220*m*, 220*c* (applied between the source terminal and the gate terminal). At the same time, the control voltage VGS of the opposite pull-up transistor 230*c*, 230*m* is reduced by the same value.

Considering, as an example, the case wherein the memory cell 600 stores the logic value 0 and the logic value 1 is to be written (source line SL at the bias voltage VS and source line $\overline{SL}$ at the ground voltage GND). In such case, the source terminal of the main pull-down transistor 220*m* receives the bias voltage VS, thereby its control voltage VGS is reduced. The main pull-down transistor 220*m* is thus turned off more easily, even when the supply voltage VDD applied to its gate terminal is of a relatively low value. At the same time, also the control voltage VGS of the complementary pull-up transistor 230*c* is reduced by the same value. It follows that the complementary pull-up transistor 230*c* turns off more easily, even when the supply voltage VDD applied to its source terminal is of a relatively low value. This makes the write operation of the memory cell 600 even more reliable (particularly in highly scaled technology and/or at low voltages).

Dual considerations apply if the memory cell 600 stores the logic value 1, and the logic value 0 is to be written.

Figure 7:
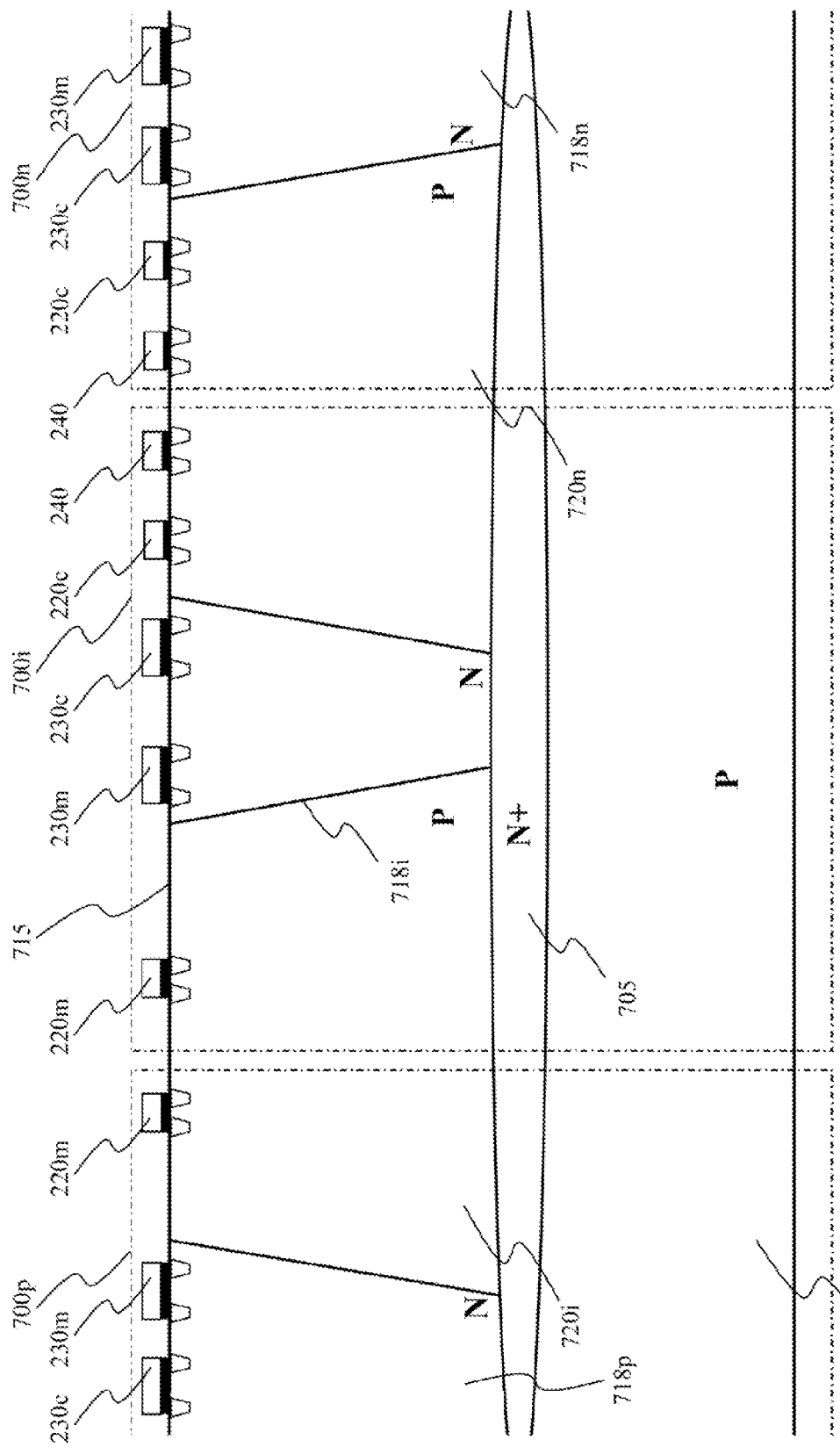
FIG. 7 schematically illustrates a cross-sectional detail of a chip of semiconductor material wherein a matrix of memory cells according to a further embodiment is formed.

FIG. 7 schematically illustrates a cross-sectional detail of the chip 300 wherein a matrix of memory cells according to another embodiment is formed. More specifically, in the figure an intermediate memory cell 700*i*, a portion of a previous memory cell 700*p*, and a portion of a next memory cell 700*n* along the same row of the matrix are visible.

Through the same techniques hereinabove described, an N+ type buried region 705 is implanted, and an N-type well, which extends from a front surface 715 of the chip 300 to contact the buried region 705, is formed for each memory cell; such N-type wells delimitate a P-type well for each memory cell (these wells substantially electrically isolated from each other). In particular, in the example illustrated in the figure, three N-type wells 718*p*, 718*i* and 718*n* (for the memory cells 700*p*, 700*i* and 700*n*, respectively) are shown, which delimitate a P-type well 720*i* (between the N-type wells 718*p* and 718*i*) and a P-type well 720*n* (between the N-type wells 718*i* and 718*n*). Each P-type well 720*i*, 720*n* is shared between a corresponding memory cell 700*i*, 700*n* and the previous memory cell 700*n*, 700*p* along the row; the P-type wells 720*i*, 720*n* along the row act alternately as main and complementary P-type wells for the corresponding pairs of memory cells 700*p*-700*i*, 700*i*-700*n* (e.g., with the P-type well 720*i* that is the main one for the memory cells 700*i*-700*p*, and the P-type well 720*n* that is the complementary one for the memory cells 700*n*-700*i*). In particular, within the P-type well 720*i* (main P-type well for the memory cell 700*i* and for the memory cell 700*p*) there are formed the main pull-down transistor 220*m* of the memory cell 700*i*, and the main pull-down transistor 220*m* of the memory cell 700*p* (each formed by an N+ type drain region, an N+ type source region, and an overbridging gate region). Inside the P-type well 720*n* (complementary P-type well for the memory cell 700*i* and for the memory cell 700n) there are instead formed the complementary pull-down transistor 220c and the pass-gate transistor 240 of the memory cell 700i, and the complementary pull-down transistor 220c and the pass-gate transistor 240 of the memory cell 700n. In this case as well, in the N-type wells 718p, 718i, 718n there are formed the pull-up transistors 230m and 230c of the corresponding memory cells 700p, 700i, 700n (each one formed by a P+ type drain region, a P+ type source region, and an overbridging gate).

The structure described above is compact, since it avoids wasting space in the chip 300 between the P-type wells of adjacent memory cells (along each row of the matrix).

Figure 8:
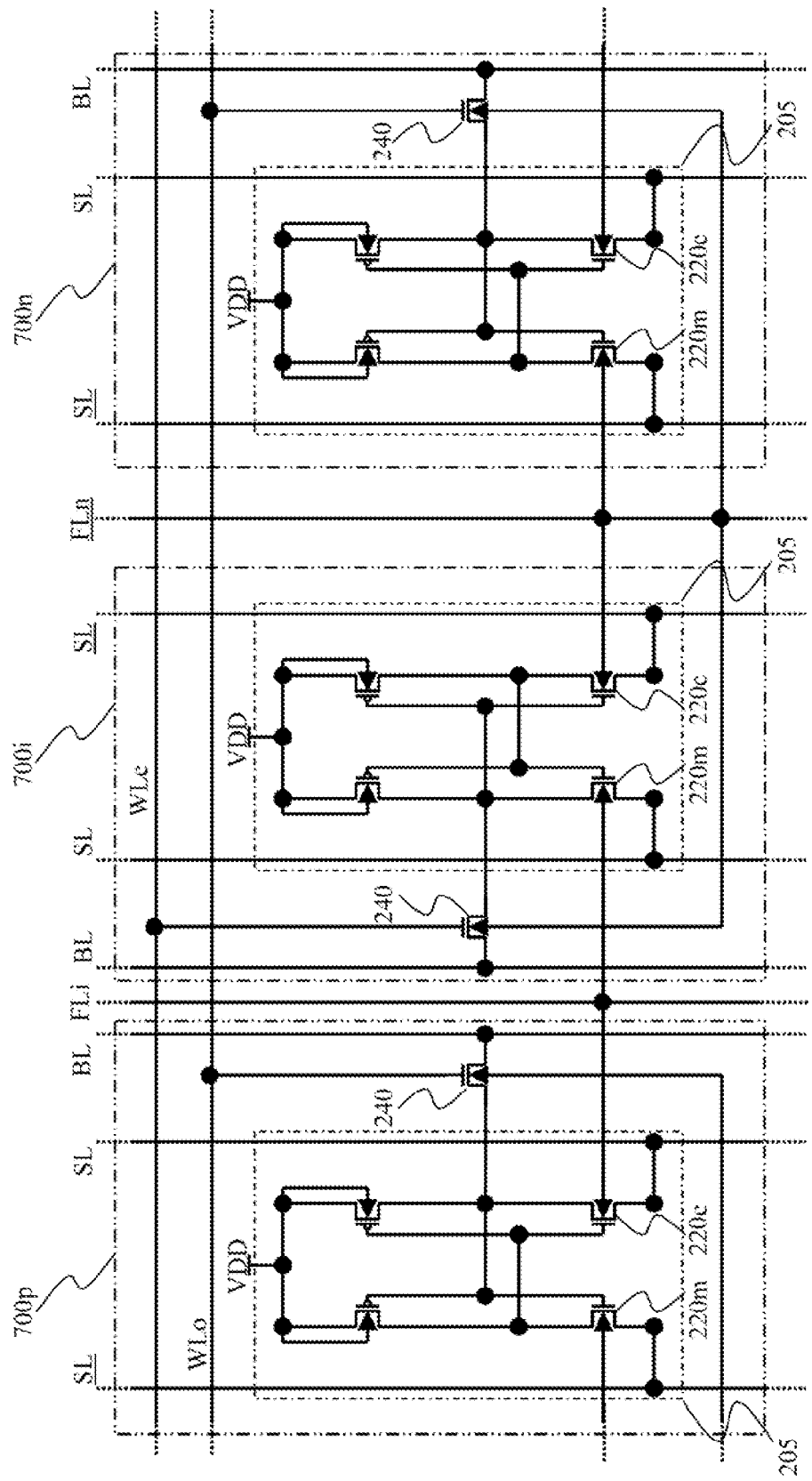
FIG. 8 illustrates a principle circuit diagram of a portion of a matrix of memory cells according to a further embodiment.

FIG. 8 illustrates a principle circuit diagram of a portion of a matrix of memory cells according to a further embodiment, wherein the memory cells 700i, 700p and 700n are visible. In this case, a single well line (adapted to provide the voltages $VFB_0$, $VFB_1$, GND or VRB) is provided for each column of the matrix; in particular, in the example shown in the figure, two well lines FLi and $\overline{FLn}$ for the memory cells 700i and 700n, respectively, are shown. Every well line FLi, $\overline{FLn}$ is shared with the previous memory cell 700p, 700i along each row of the matrix. In particular, the well line FLi (main well line for the memory cells 700i and 700p) is coupled to the bulk terminals of both the main pull-down transistor 220m of the memory cell 700i and the main pull-down transistor 220m of the memory cell 700p. Similarly, the $\overline{FLn}$ well line (complementary well line for the memory $\overline{cells}$ 700i and 700n) is coupled to the bulk terminals of both the transistors 240, 220c of the memory cell 700i and the transistors 240, 220c of the memory cell 700n.

In an embodiment, a pair of word lines is provided for each row of the matrix. In particular, an odd word line WLo is coupled to the gate terminal of the pass-gate transistor 240 of the memory cells (e.g., the memory cells 700p and 700n) that occupy an odd position in the row, and an even word line WLe is coupled to the gate terminal of the pass-gate transistor 240 of the memory cells (e.g., the memory cell 700i) that occupy an even position in the row.

During a write operation of a selected bit, for example, in the memory cell 700i, the corresponding word line WLe is enabled (to the supply voltage VDD) and the other word line WLo is disabled (to the ground voltage GND). The (complementary) well line $\overline{FLn}$ of the memory cell 700i to be written provides the $\overline{writing\ bias}$ voltage $VFB_0$, $VFB_1$ while all the other well lines provide the ground voltage GND.

As above, the bulk terminal of the transistors 240 and 220c of the memory cell 700i receives the writing bias voltage $VFB_0$ or $VFB_1$ (from the well line $\overline{FLn}$), according to whether the selected bit to be written in the $\overline{memory}$ cell 700i has the logic value 0 or 1, respectively, so that their threshold voltage VTN is equal to the writing threshold voltage $VTN_{F0}$ or $VTN_{F1}$, respectively (in order to make more reliable the write operation).

However, the well line $\overline{FLn}$ applies the same writing bias voltage $VFB_0$, $VFB_1$ also $\overline{to\ the}$ bulk terminals of the transistors 240 and 220c of the memory cell 700n, so that even their threshold voltage VTN is equal to the writing threshold voltage $VTN_{F0}$, $VTN_{F1}$. In this case, the odd word line WLo provides the ground voltage GND to the gate terminal of the pass-gate transistor 240 of the memory cell 700n (as well as to the gate terminal of the pass-gate transistor 240 of the memory cell 700p). Therefore, the pass-gate transistor 240 of the memory cell 700p, 700n will remain off. In particular, this configuration prevents the pass-gate transistor 240 of the memory cell 700n from turning on due to its writing threshold voltage $VTN_{F0}$, $VTN_{F1}$, which might in turn cause a turning on of the complementary pull-down transistor 220c of the memory cell 700n due to its writing threshold voltage $VTN_{F0}$, $VTN_{F1}$, leading to a spurious write of the logic value 1 in the memory cell 700n.

During a read operation of the same memory cell 700i, the corresponding word line WLe is enabled (to the supply voltage VDD) while the other word line WLo is disabled (to the ground voltage GND). The (main) well line FLi of the memory cell 700i to be read provides the reading bias voltage VRB, while all the other well lines provide the ground voltage GND.

As above, the bulk terminal of the main pull-down transistor 220m of the memory cell 700i receives the reading bias voltage VRB from the well line FLi, so that its threshold voltage VTN is equal to the reading threshold voltage $VTN_R$ (in order to make it stable the read operation).

The well line FLi applies the same reading bias voltage VRB also to the bulk terminal of the main pull-up transistor 220m of the memory cell 700p, so that also its threshold voltage VTN is equal to the reading threshold voltage $VTN_R$. Again, the odd word line WLo provides the ground voltage GND to the gate terminal of the pass-gate transistor 240 of the memory cell 700p. Therefore, the pass-gate transistor 240 of the memory cell 700p will remain turned off. This configuration prevents influencing the adjacent memory cells during the read operation. In this way, the same benefits as above may be achieved (i.e., reliable writing and stable reading) despite the interference between each pair of adjacent memory cells in each row (caused by their shared well lines).

Naturally, in order to satisfy local and specific requirements, a person skilled in the art may apply to an embodiment described above many logical and/or physical modifications and alterations. More specifically, although one or more embodiments have been described with a certain degree of particularity, it is understood that various omissions, substitutions, and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment may be incorporated in any other embodiment as a matter of general design choice.

For example, similar considerations apply if a memory device has a different architecture or includes equivalent components (either separated or combined to each other, in whole or in part); moreover, a memory device may have different operating characteristics. The logic values 0 and 1 may be represented by different reference voltages (also reversed with respect to each other). Each memory cell may have a different architecture (for example, with resistive load) or may be formed by different types of transistors, such as JFET transistors; similarly, in a memory cell the transistors may present opposite doping, that is P-channel MOS pass-gate and pull-down transistors and N-channel MOS pull-up transistor. Similarly, the chip on which the memory device is integrated may have an N-type doping (with isolated N-type wells formed in P-type wells).

Nothing prevents modifying the threshold voltage of one or more transistors of the memory cell selectively according to the logic value to be written in another way.

The threshold voltage of one or more transistors of the memory cell may also be selectively modified in the same way for writing both the logic values.

Nothing prevents applying the selective biasing of the source terminals to a memory cell with a different structure. Moreover, the selective biasing of the source terminals may be used independently of the selective biasing of the bulk terminals, and vice-versa.

Alternatively or in addition, the bias voltage may be applied to the source terminals of the pull-up transistors (through a bias line coupled thereto). In any case, the voltages used to bias the source terminal of the main transistors and of the complementary transistors of the memory cell during its write operation may also be both different from the voltage applied thereto in its read operation and/or standby condition.

Alternatively, the P-type well doping may be modified in such a way to make the main pull-down transistor more conductive than the pass-gate transistor to optimize the reading operation and/or the standby condition.

Similar considerations also apply by operating on other process parameters (e.g., the doping of the regions inside the P-type well).

Moreover, nothing prevents biasing the transistors in order to modify the threshold voltages of one or more transistors in other ways during the read operation and/or in the standby condition. In particular, the main well and the complementary well may be biased to a same voltage during the read operation and/or the standby condition, even simply equal to the ground voltage GND.

Nothing prevents adjusting the form factors of one or more transistors of the memory cell in another way. In particular, the form factors of the transistors of the memory cell may be sized to optimize the reading operation and/or the standby condition.

In addition, the isolated well may be common to more than two memory cells, for example, a single isolated well may be common to all the memory cells of two adjacent columns. More than two word lines may also be provided to access sub-groups of memory cells arranged in a same row of the matrix of the memory device separately. Conversely, a single word line per row may be provided even if the isolated wells are shared among two or more memory cells.

The above-mentioned values of the bias voltages (for the common well and/or for the source terminals during the write operation, during the read operation and/or in the standby condition) are merely indicative, and should not be understood as limitative.

An embodiment lends itself to be implemented by an equivalent method (using similar steps, removing some steps being not essential, or adding further optional steps); moreover, the steps may be performed in different order, in parallel or overlapped (at least in part).

It should be readily apparent that the proposed memory device might be part of the design of an integrated device. The design may also be created in a programming language; in addition, if the designer does not manufacture the integrated device or its masks, the design may be transmitted through physical means to others. Anyway, the resulting integrated device may be distributed by its manufacturer in the form of a raw wafer, as a naked chip (e.g., die), or in packages.

Moreover, the memory device may be integrated with other circuits in the same chip, or it may be mounted in intermediate products (such as motherboards) and coupled with one or more other chips (such as a controller or processor). In any case, the memory device may be adapted to be used in complex systems (such as a mobile phone).

From the foregoing it will be appreciated that, although specific embodiments have been described herein for purposes of illustration, various modifications may be made without deviating from the spirit and scope of the disclosure.

Furthermore, where an alternative is disclosed for a particular embodiment, this alternative may also apply to other embodiments even if not specifically stated.

The invention claimed is:

1. A memory device of SRAM type integrated in a chip of semiconductor material, the memory device including
   a plurality of memory cells each for storing a binary data having a first logic value represented by a first reference voltage or a second logic value represented by a second reference voltage,
   wherein each memory cell includes a bistable latch having a main terminal and a complementary terminal, each bistable latch including cross-coupled inverters and each cross-coupled inverter including a field effect main storage transistor and a field effect complementary storage transistor,
      the field effect main storage transistors coupled to the main terminal for maintaining the main terminal at the reference voltage corresponding to the stored logic value or to a complement thereof,
      the field effect complementary storage transistors coupled to the complementary terminal for maintaining the complementary terminal at the reference voltage corresponding to the complement of the logic value associated with the main terminal, and
      a field effect access transistor for accessing the main terminal, and
   wherein the chip includes an isolated well, the access transistor and at least one of the complementary storage transistors being formed in the isolated well.

2. The memory device according to claim 1,
   wherein the cross-coupled inverters in the bistable latch includes a first inverter having a main storage transistor and a complementary storage transistor for receiving the first reference voltage, and a second inverter having a further main storage transistor and a further complementary storage transistor for receiving the second reference voltage, the main storage transistors and the complementary storage transistors having a control terminal coupled to the complementary terminal and to the main terminal, respectively,
   wherein the chip includes a further isolated well, the access transistor and the complementary storage transistor being formed in the isolated well and the main storage transistor being formed in the further isolated well, and
   wherein the memory device further includes biasing means for applying a first bias voltage to the isolated well and a second bias voltage to the further isolated well during a write operation of the second logic value in the memory cell, the first bias voltage imposing a first threshold voltage to the access transistor and to the complementary storage transistor and the second bias voltage imposing a second threshold voltage to the main storage transistor, with the first threshold voltage lower in absolute value than the second threshold voltage.

3. The memory device according to claim 2, wherein the biasing means include means for applying a third bias voltage to the isolated well and the second bias voltage to the further isolated well during a write operation of the first logic value in the memory cell, the third bias voltage imposing a third threshold voltage to the access transistor and to the complementary storage transistor, with the third threshold voltage ranging in absolute value between the first threshold voltage and the second threshold voltage.

4. The memory device according to claim 1,
   wherein each storage transistor has a first conduction terminal for receiving a corresponding one between the first reference voltage and the second reference voltage, and a second conduction terminal coupled to the corresponding main terminal or complementary terminal, and wherein the memory device includes further biasing means for applying a further first bias voltage or a further second bias voltage to the first conduction terminal of at least a selected one between the main storage transistor and the further main storage transistor and for applying the second bias voltage or the first bias voltage to the first conduction terminal of at least a selected one between the complementary storage transistor and the further complementary storage transistor during a write operation of the second logic value or of the first logic value, respectively, in the memory cell, the first bias voltage reducing a control voltage of each selected storage transistor and of the further storage transistor having the control terminal coupled to the second conduction terminal of the selected storage transistor with respect to the second bias voltage.

5. The memory device according to claim 2, wherein each storage transistor has a first conduction terminal for receiving a corresponding one between the first reference voltage and the second reference voltage, and a second conduction terminal coupled to the corresponding main terminal or complementary terminal, and wherein the memory device includes further biasing means for applying a further first bias voltage or a further second bias voltage to the first conduction terminal of at least a selected one between the main storage transistor and the further main storage transistor and for applying the second bias voltage or the first bias voltage to the first conduction terminal of at least a selected one between the complementary storage transistor and the further complementary storage transistor during a write operation of the second logic value or of the first logic value, respectively, in the memory cell, the first bias voltage reducing a control voltage of each selected storage transistor and of the further storage transistor having the control terminal coupled to the second conduction terminal of the selected storage transistor with respect to the second bias voltage.

6. The memory device according to claim 5, wherein the at least one selected main storage transistor is the main storage transistor and the at least one selected complementary storage transistor is the complementary storage transistor.

7. The memory device according to claim 2, wherein the access transistor and the complementary storage transistor have a lower conductivity than a conductivity of the main storage transistor.

8. The memory device according to claim 7, wherein the isolated well has a dopant concentration different from a dopant concentration of the further isolated well for obtaining the conductivity of the access transistor and of the complementary storage transistor lower than the conductivity of the main storage transistor.

9. The memory device according to claim 3, wherein the biasing means include means for applying a fourth bias voltage to the isolated well and the second bias voltage to the further isolated well during a read operation of the memory cell and/or in a standby condition of the memory cell, the fourth bias voltage imposing a fourth threshold voltage to the main storage transistor and the second bias voltage imposing the second threshold voltage to the access transistor and to the complementary storage transistor, with the fourth threshold voltage ranging in value between the second threshold voltage and third threshold voltage.

10. The memory device according to claim 9, wherein the access transistor is sized for having a conductivity greater than a conductivity of at the least one main storage transistor.

11. The memory device according to claim 2, wherein the memory cells are organized in a matrix with a plurality of rows, the isolated well of each memory cell of each row successive to a first memory cell of the row being in common with the isolated well of a previous memory cell of the row, and the further isolated well of each memory cell of each row before a last memory cell of the row being in common with the further isolated well of a next memory cell of the row, for each row the memory device further including an even word line coupled to the control terminal of the access transistor of the memory cells in even positions in the row and an odd word line coupled to the control terminal of the access transistor of the memory cells in odd positions in the row for selectively turning on the access transistors of the memory cells of the row.

12. The memory device according to claim 1, wherein the first bias voltage, the third bias voltage, the fourth bias voltage, and/or the further first bias voltage are comprised between the first reference voltage and the second reference voltage, and wherein the second bias voltage and/or the further second bias voltage are equal to the first reference voltage.

13. A memory cell, comprising:
a first well having a first conductivity;
a data node;
a latch node;
a first inverter having an input node coupled to the latch node, an output node, and only a portion of the first inverter being disposed in the well;
a second inverter having an input node coupled to the output node of the first inverter, and having an output node coupled to the latch node; and
an access transistor disposed in the well and coupled between the data and latch nodes.

14. The memory cell of claim 13 wherein the well has a P-type conductivity.

15. The memory cell of claim 13 wherein the portion of the first inverter disposed in the well comprises a pull-down transistor.

16. The memory cell of claim 13 wherein the second inverter has no portion disposed in the well.

17. The memory cell of claim 13, further comprising no access transistor coupled to the output node of the first inverter.

18. The memory cell of claim 13, further comprising a bias node coupled to the first well.

19. The memory cell of claim 13, further comprising:
a second well of the conductivity;
a portion of the second inverter disposed in the second well;
a first bias node coupled to the first well; and
a second bias node coupled to the second well.

20. The memory cell of claim 13, further comprising:
a supply node;
first and second bias nodes;
wherein the first inverter has a first conduction node coupled to the supply node and a second conduction node coupled to the first bias node; and
wherein the second inverter has a first conduction node coupled to the supply node and a second conduction node coupled to the second bias node.

21. The memory cell of claim 13, further comprising:
a supply node;
first and second bias nodes;

wherein the first inverter comprises a pull-up transistor coupled to the supply node and a pull-down transistor coupled to the first bias node; and wherein the second inverter has a pull-up transistor coupled to the supply node and a pull-down transistor coupled to the second bias node.

22. The memory cell of claim 13, further comprising:
a supply node;
a first bias node coupled to the well;
second and third bias nodes;
wherein the first inverter comprises a pull-up transistor coupled to the supply node, and the portion of the first inverter comprising a pull-down transistor coupled to the second bias node; and
wherein the second inverter has a pull-up transistor coupled to the supply node and a pull-down transistor coupled to the third bias node.

23. An integrated circuit, comprising:
a first well having a conductivity;
a first data line; and
a first memory cell, including
a data node coupled to the data line;
a latch node;
a first inverter having an input node coupled to the latch node, an output node, and the first inverter including a plurality of components and only some of the components being disposed in the well;
a second inverter having an input node coupled to the output node of the first inverter, and having an output node coupled to the latch node; and
a first access transistor disposed in the well and coupled between the data and latch nodes.

24. The integrated circuit of claim 23, further comprising a bias line coupled to the first well.

25. The integrated circuit of claim 23, further comprising first and second bias lines respectively coupled to the first and second inverters.

26. The integrated circuit of claim 23, further comprising:
a second data line;
an enable line coupled to the access transistor of the first memory cell; and
a second first memory cell, including
a second data node coupled to the second data line;
a second latch node;
a third inverter having an input node coupled to the second latch node, an output node, and the third inverter including a plurality of components and only some of the components being disposed in the well;
a fourth inverter having an input node coupled to the output node of the third inverter, and having an output node coupled to the second latch node; and
a second access transistor disposed in the well, coupled to the enable line, and coupled between the second data and second latch nodes.

27. The integrated circuit of claim 26, further comprising a bias line coupled to the well.

28. The integrated circuit of claim 26, further comprising first, second, third, and fourth bias lines respectively coupled to the first, second, third, and fourth inverters.

29. The integrated circuit of claim 23, further comprising:
a second well having the first conductivity;
a bias line coupled to the first and second wells; and
a second first memory cell, including
a second data node coupled to the first data line;
a second latch node;
a third inverter having an input node coupled to the second latch node, an output node, and the third inverter including a plurality of components and only some of the components being disposed in the second well;
a fourth inverter having an input node coupled to the output node of the third inverter, and having an output node coupled to the second latch node; and
a second access transistor disposed in the second well and coupled between the second data and second latch nodes.

30. The integrated circuit of claim 29, further comprising a bias line coupled to the first and second wells.

31. The integrated circuit of claim 26, further comprising:
a first bias line coupled to the first and third inverters; and
a second bias line coupled to the second and fourth inverters.

32. A system, comprising:
a first integrated circuit, comprising:
a well having a conductivity;
a data line; and
a memory cell, including
a data node coupled to the data line;
a latch node;
a first inverter having an input node coupled to the latch node, an output node, and the first inverter including a plurality of transistors with only some of the transistors disposed in the well;
a second inverter having an input node coupled to the output node of the first inverter, and having an output node coupled to the latch node; and
an access transistor disposed in the well and coupled between the data and latch nodes; and
a second integrated circuit coupled to the first integrated circuit.

33. The system of claim 32 wherein the first and second integrated circuits are disposed on a same die.

34. The system of claim 32 wherein the first and second integrated circuits are disposed on respective dies.

35. The system of claim 32 wherein one of the first and second integrated circuits comprises a computing circuit.

36. The system of claim 32 wherein one of the first and second integrated circuits comprises a memory array.

37. A method, comprising:
causing a memory cell to transition between a stand-by state and an access state, the memory cell having a latch node coupled to a conduction node of an access transistor, a conduction node of a first latch transistor, and a control node of a second latch transistor; and
in response to causing the memory cell to transition states, changing a conductivity of at least one of the access, first latch, and second latch transistors relative to at least another of the access, first latch, and second latch transistors.

38. The method of claim 37 wherein changing the conductivity comprises changing respective bulk-biasing levels of the access and second latch transistors relative to a bulk-biasing level of the first latch transistor.

39. The method of claim 37 wherein changing the conductivity comprises changing a source-biasing level of the first latch transistor relative to a source-biasing level of the second latch transistor.

40. The method of claim 37 wherein changing the conductivity comprises:
changing respective bulk-biasing levels of the access and second latch transistors relative to a bulk-biasing level of the first latch transistor; and
changing a source-biasing level of the first latch transistor relative to a source-biasing level of the second latch transistor.

41. The method of claim 37 wherein:

causing the memory cell to transition states comprises writing the memory cell; and changing the conductivity comprises increasing the respective conductivities of the access and second latch transistors relative to the conductivity of the first latch transistor.

42. The method of claim 37 wherein:

causing the memory cell to transition states comprises writing a data value to the memory cell; and changing the conductivity comprises increasing the respective conductivities of the access and second latch transistors relative to the conductivity of the first latch transistor by a level that is related to the data value.

43. The method of claim 37 wherein:

causing the memory cell to transition states comprises writing a low logic value to the latch node of the memory cell; and changing the conductivity comprises increasing the respective conductivities of the access and first latch transistors relative to the conductivity of the second latch transistor.

44. The method of claim 37 wherein:

causing the memory cell to transition states comprises writing a high logic value to the latch node of the memory cell; and changing the conductivity comprises increasing the respective conductivities of the access and second latch transistors relative to the conductivity of the first latch transistor.

45. The method of claim 37 wherein:

causing the memory cell to transition states comprises reading a data value from the latch node of the memory cell; and changing the conductivity comprises increasing the respective conductivity of the first latch transistor relative to the access and second latch transistors.

46. The method of claim 37 wherein:

causing the memory cell to transition states comprises reading a data value from the latch node of the memory cell; and changing the conductivity comprises increasing the respective conductivity of the first latch transistor relative to the second latch transistor.

47. The method of claim 37 wherein:

causing the memory cell to transition states comprises causing the memory cell to enter a standby state; and changing the conductivity comprises increasing the respective conductivity of the first latch transistor relative to the access and second latch transistors.

48. The method of claim 37 wherein:

causing the memory cell to transition states comprises causing the memory cell to enter a standby state; and changing the conductivity comprises increasing the respective conductivity of the first latch transistor relative to the second latch transistor.

* * * * *